(12) United States Patent
Woo

(10) Patent No.: US 8,007,136 B2
(45) Date of Patent: Aug. 30, 2011

(54) LIGHT EMITTING DIODE

(75) Inventor: Sung Yong Woo, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 233 days.

(21) Appl. No.: 12/159,675

(22) PCT Filed: Dec. 14, 2006

(86) PCT No.: PCT/KR2006/005452
§ 371 (c)(1),
(2), (4) Date: Jun. 30, 2008

(87) PCT Pub. No.: WO2007/074983
PCT Pub. Date: Jul. 5, 2007

(65) Prior Publication Data
US 2009/0251902 A1    Oct. 8, 2009

(30) Foreign Application Priority Data
Dec. 29, 2005  (KR) .......................... 10-2005-0133862

(51) Int. Cl.
*F21V 7/04* (2006.01)
(52) U.S. Cl. ......... 362/296.07; 362/311.02; 362/311.15; 362/320
(58) Field of Classification Search .................. 362/255, 362/278, 296.01, 296.04, 296.05, 296.07, 362/311.01, 311.02, 311.03, 311.04, 311.14, 362/311.15, 320, 327; 257/98, 99, 100
See application file for complete search history.

(56) References Cited

U.S. PATENT DOCUMENTS

| 2,107,362 A | * | 2/1938 | Bergstrom ...................... 40/583 |
| 2004/0041222 A1 | | 3/2004 | Loh |
| 2006/0092644 A1 | * | 5/2006 | Mok et al. ..................... 362/327 |
| 2006/0278882 A1 | * | 12/2006 | Leung et al. ................... 257/98 |

FOREIGN PATENT DOCUMENTS

| JP | 2002-009345 | 1/2002 |
| JP | 2005175048 | 6/2005 |

(Continued)

OTHER PUBLICATIONS

TW Preliminary Notice of the First Office Action dated Aug. 20, 2009.

*Primary Examiner* — Y My Quach Lee
(74) *Attorney, Agent, or Firm* — H.C. Park & Associates, PLC

(57) ABSTRACT

Disclosed is a light emitting diode (LED). The LED includes a light emitting chip, a reflector formed with an annular groove in an inner surface thereof and surrounding the light emitting chip, and a lens engaged with the groove of the reflector. An inner diameter of a lens insertion portion of the groove is smaller than an outer diameter of the lens, so that the lens can be engaged with the groove through elastic deformation. Since the separately manufactured lens is engaged with and coupled into the groove of the reflector, the lens can be fixed through a simple process and aligned without an error. Since the lens is engaged with the groove of the reflector, the lens is prevented from being easily separated. In addition, since there is no need for the use of an adhesive, it is possible to prevent degradation of the reliability of the LED.

7 Claims, 3 Drawing Sheets

FOREIGN PATENT DOCUMENTS

| | | |
|---|---|---|
| KR | 10-2005-0012372 | 2/2005 |
| KR | 10-2005-0082711 | 8/2005 |
| KR | 10-2005-0110508 | 11/2005 |
| TW | 527017 | 4/2003 |
| TW | M261834 | 4/2005 |
| TW | M261835 | 4/2005 |
| TW | M262843 | 4/2005 |
| WO | WO 2005053041 A1 * | 6/2005 |

* cited by examiner

[Fig. 1]
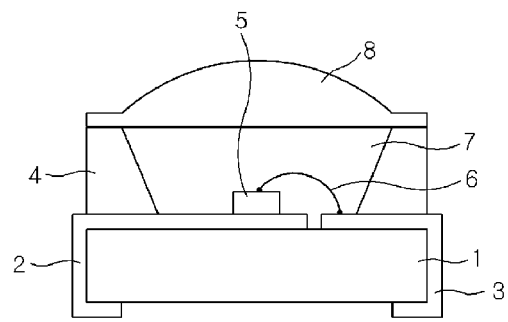
[Fig. 2]
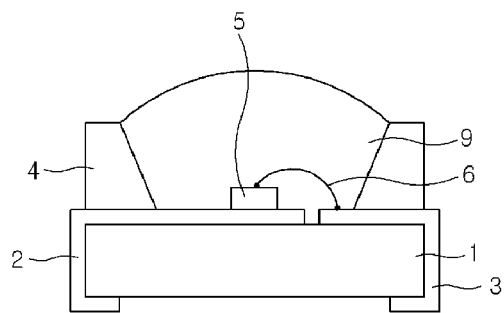
[Fig. 3]
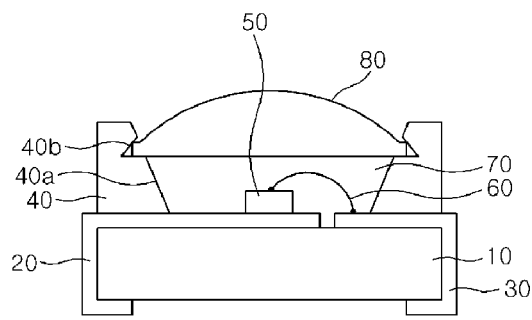
[Fig. 4]
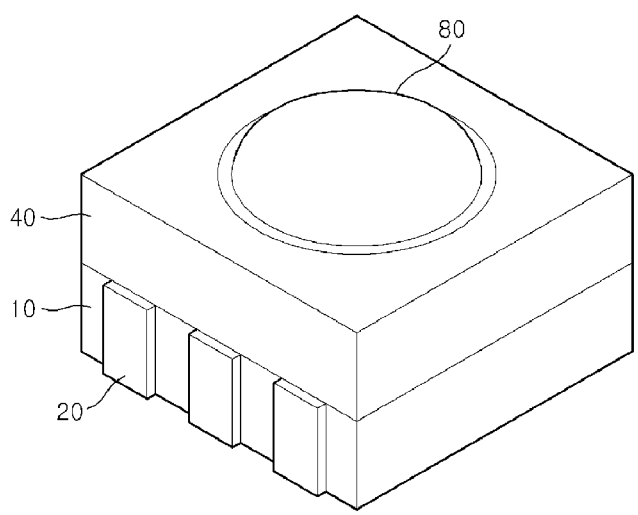

[Fig. 5]
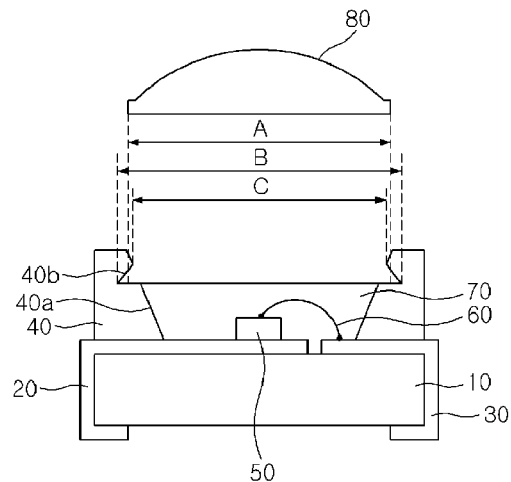
[Fig. 6]
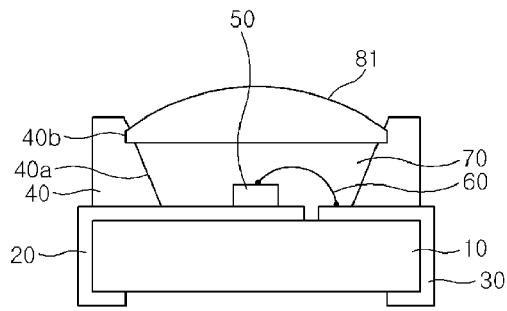
[Fig. 7]
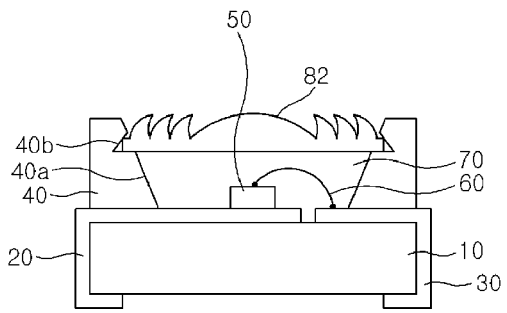
[Fig. 8]
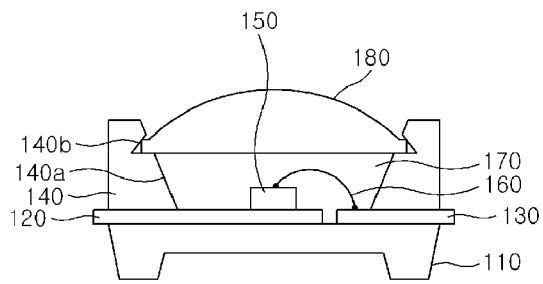

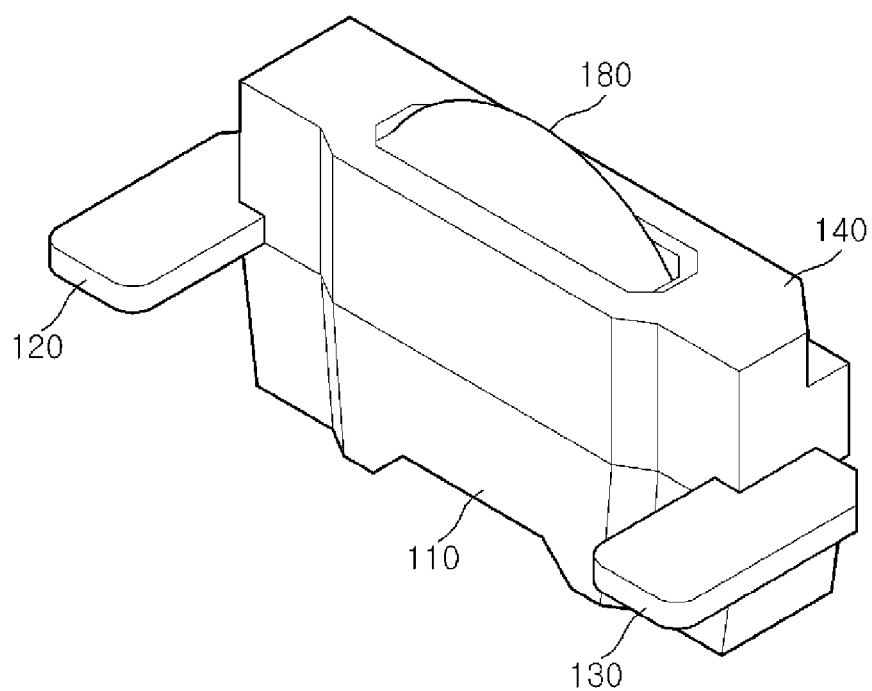
[Fig. 9]

LIGHT EMITTING DIODE

CROSS REFERENCE TO RELATED APPLICATIONS

This application is the National Stage of International Application No. PCT/KR2006/005452, filed on Dec. 14, 2006, and claims priority from and the benefit of Korean Patent Application No. 10-2005-0133862, filed on Dec. 29, 2005, which are both hereby incorporated by reference for all purposes as if fully set forth herein.

BACKGROUND OF THE INVENTION

1. Field of the Invention

The present invention relates to a light emitting diode, and more particularly, to a light emitting diode, wherein a lens can be easily formed thereon and an attachment force of the lens thereto is improved.

2. Discussion of the Background

A light emitting diode (LED) is a device which emits light due to recombination of electrons and holes in a p-n junction structure of a semiconductor. The LED has features such as low power consumption, long life span, narrow installation space and high resistance to vibration. Accordingly, the LED has been used in various fields and its applications are expanded to parts for a variety of information processing and communication equipment. As the applications of the LED are expanded, the LEDs having high luminance and color rendering index are further required. Thus, studies have been continuously conducted on a lens for focusing light, a chip, and materials suitable for fabricating the LED.

Meanwhile, conventional LEDs are provided in various types such as a lamp type LED and a chip type LED. In addition, there is provided an LED that has improved luminance by forming a reflector surrounding a light emitting chip.

FIGS. 1 and 2 are sectional views illustrating examples of such a conventional LED.

Referring to these figures, the conventional LED includes a substrate 1, electrodes 2 and 3 formed on the substrate 1, a light emitting chip 5 mounted on the electrode 2, and a reflector 4 formed on the substrate 1 and having a hollow portion to surround the light emitting chip 5.

The LED has a lens unit at its upper portion to improve light emission efficiency by controlling a refraction of light. To this end, as shown in FIG. 1, the LED includes a molding portion 7 formed in the hollow portion of the reflector 4 to encapsulate the light emitting chip 5, and a lens 8 separately manufactured and attached to upper ends of the reflector 4 and the molding portion 7.

Korean Patent Laid-Open Publication No. 2005-0012372 discloses an LED package having high luminance and superior heat dissipation by mounting a plurality of high-power LED chips in a package type. The LED package includes a wiring portion, the plurality of LED chips, a reflection cup portion, and a lens portion disposed on the reflection cup portion to transmit light emitted from the LED chips outwardly. The lens portion is coupled to the reflection cup portion by means of an adhesive with high heat resistance. Furthermore, pins, which are used for mounting the LED package, may be arranged along an edge of the lens portion after coupling the lens with the reflection cup portion. The pins strongly fix the lens to the LED package. However, this LED with such a structure has disadvantages in that the lens may be easily separated from the LED package when the adhesive is not cured completely, and that reliability may be lowered due to deformation of the adhesive. Further, since the processes for fixing the lens portion using the adhesive or pins are added, the overall fabricating processes are complicated. In addition, since it is difficult to precisely align the lens in place, an error in the position of the lens may occur, resulting in degradation of light emission efficiency.

Alternatively, as shown in FIG. 2, a lens-shaped molding portion 9 may be formed inside the reflector 4. The constitution and effects of this LED are specifically disclosed in Korean Patent Laid-Open Publication No. 2005-0082711. However, the technique of forming the lens-shaped molding portion 9 increases fabrication cost and is not suitable for mass production. This technique has a limitation on improvement of efficiency as compared with the case where the lens is separately manufactured and then attached.

SUMMARY OF THE INVENTION

An object of the present invention is to provide an LED with a lens separately manufactured and then coupled, wherein the lens can be easily coupled and aligned without an error.

Another object of the present invention is to provide an LED that can prevent separation of a lens and degradation of reliability due to deformation of an adhesive.

A light emitting diode (LED) according to embodiments of the present invention comprises a light emitting chip; a reflector formed with an annular groove in an inner surface thereof and surrounding the light emitting chip; and a lens engaged with the groove of the reflector. An inner diameter of a lens insertion portion of the groove is smaller than an outer diameter of the lens, so that the lens can be engaged with the groove through elastic deformation.

Meanwhile, the lens may include an outwardly-protruding stepped portion at a peripheral portion of the lens. The lens may have a convex central portion or may be a Fresnel lens.

A light reflecting material containing Al or Ag may be coated on the inner surface of the reflector. A molding portion encapsulating the light emitting chip may be disposed below the lens engaged with the groove of the reflector.

According to the present invention, since the separately manufactured lens is engaged with and coupled into the groove of the reflector, the lens can be fixed through a simple process and aligned without an error. Since the lens is engaged with the groove of the reflector, the lens is prevented from being separated. In addition, since there is no need for the use of an adhesive, it is possible to prevent degradation of the reliability of the LED.

BRIEF DESCRIPTION OF THE DRAWINGS

FIGS. 1 and 2 are sectional views illustrating examples of a conventional LED.

FIGS. 3 and 4 are a sectional view and a perspective view illustrating an LED according to a first embodiment of the present invention, respectively.

FIG. 5 is an exploded sectional view illustrating the LED according to the first embodiment of the present invention.

FIG. 6 is a sectional view illustrating another example of the LED according to the first embodiment of the present invention.

FIG. 7 is a sectional view illustrating a further example of the LED according to the first embodiment of the present invention.

FIGS. 8 and 9 are a sectional view and a perspective view illustrating an LED according to a second embodiment of the present invention, respectively.

DETAILED DESCRIPTION OF THE ILLUSTRATED EMBODIMENTS

Hereinafter, preferred embodiments of the present invention will be described in detail with reference to the accompanying drawings. The following embodiments are provided only for illustrative purposes to fully convey the scope of the present invention to those skilled in the art. Therefore, the present invention is not limited to the embodiments set forth herein but can be implemented in different forms. In the drawings, the widths, lengths, thicknesses and the like of components may be exaggerated for convenience of illustration. Like reference numerals indicate like elements throughout the specification.

FIGS. 3 and 4 are a sectional view and a perspective view illustrating an LED according to a first embodiment of the present invention, respectively.

Referring to the figures, the LED includes a substrate 10, electrodes 20 and 30 formed on the substrate 10, a light emitting chip 50 mounted on the substrate 10 and electrically connected to the electrodes 20 and 30, and a reflector 40 formed on the substrate 10 and having a hollow portion to surround the light emitting chip 50. A molding portion 70 encapsulates the light emitting chip 50 in the hollow portion of the reflector 40. A lens 80 is coupled to an upper end of the molding portion 70 while being engaged with a groove 40b formed in an inner surface 40a of the reflector 40.

In this embodiment, the electrodes 20 and 30 comprise first and second electrodes 20 and 30 to be connected to an external power source. The electrodes 20 and 30 may be formed on the substrate 10 by means of a printing method or attached to the substrate by interposing an adhesive therebetween. In addition, the electrodes 20 and 30 may be made of a metallic material containing Cu or Al.

The light emitting chip 50 is mounted on the substrate 10 by using various mounting methods. The light emitting chip 50 may be mounted on the first electrode 20 by applying silver paste as shown in FIG. 3, or on a predetermined region of the substrate 10 by using a non-conductive adhesive.

The light emitting chip 50 is mounted on the first electrode 20 and then electrically connected to the second electrode 30 through a single wire 60. In this embodiment, the light emitting chip 50 having a positive electrode and a negative electrode respectively on its top and bottom flat surfaces is mounted directly on the electrode 20 and electrically connected to the electrode 30 through the single wire 60, as shown in FIG. 3. If a light emitting chip 50 having a positive electrode and a negative electrode on its top flat surface is used, the light emitting chip 50 can be connected to the electrodes 20 and 30 through two wires 60.

The shapes and numbers of the electrodes 20 and 30, or a method of mounting the light emitting chip 50 with relation to the electrodes may be modified variously. For example, a plurality of light emitting chips 50 may be mounted respectively on a plurality of electrodes and then individually driven, if necessary.

Meanwhile, a phosphor (not shown) for converting the wavelength of light emitted from the light emitting chip 50 can be disposed on or above the light emitting chip 50. The phosphor may be coated on the light emitting chip 50 or uniformly distributed in the molding portion 70.

The reflector 40 with the hollow portion to surround the light emitting chip 50 is formed on the substrate 10. An inner surface 40a of the reflector 40, which defines the hollow portion, has a predetermined slope to externally reflect light emitted from the light emitting chip 50, thereby improving light emission efficiency. To further improve reflectivity of light, a light reflecting material containing Al or Ag may be coated on the inner surface 40a defining the hollow portion. In addition, the annular groove 40b in which the lens 80 is seated is formed at a predetermined position on the inner surface 40a of the reflector 40.

Meanwhile, the molding portion 70 for encapsulating the light emitting chip 50 is formed in the hollow portion of the reflector 40. The molding portion 70 may be formed to be at a level lower than a position where the groove 40b is formed. The molding portion 70 is formed by filling a transparent epoxy resin or silicone resin in the hollow portion and curing or semi-curing the filled resin.

The lens 80 is seated in the groove 40b of the reflector 40 on the molding portion 70. The lens 80 serves to focus or diffuse light emitted from the light emitting chip 50. The propagation path of light emitted from the light emitting chip 50 can be diversely altered by changing the material of the lens 80 or adjusting the curvature of the lens 80.

As the lens 80 is seated and fixed in the groove 40b of the reflector 40 as described above, the lens is coupled to the LED. To specifically describe the foregoing, FIG. 5 shows an exploded sectional view of the LED according to this embodiment. Referring to the figure, the lens 80 is in the form of an upward convex lens and has a stepped portion outwardly protruding from an outer peripheral surface of a lower end of the lens 80. The groove 40b formed in the reflector 40 includes a seating surface on which the lens 80 is seated, and an inner surface inclined in a direction opposite to the inclined direction of the inner surface 40a of the reflector 40. Preferably, an inner diameter B of an inner periphery of a lower end of the groove 40b including the seating surface is equal to or greater than an outer diameter A of the lower end of the lens 80, and an inner diameter C of an inner periphery of an upper end of the groove 40b is smaller than the outer diameter A of the lower end of the lens 80. Preferably, the lens 80 or the reflector 40 is made of an elastically-deformable material. That is, since the inner diameter C of a lens insertion portion of the groove 40b, i.e., the upper end of the groove 40b, is smaller than the outer diameter A of the lens 80, the lens 80 can be engaged with the groove 40b through elastic deformation.

Although the outwardly-protruding stepped portion is formed at the periphery surface of the lens 80 in this embodiment, the stepped portion may be eliminated. The coupling configuration of the lens 80 and the groove 40b may be modified variously. For example, as shown in FIG. 6, the lens 81 may be a convex lens without a stepped portion, and the groove 40b of the reflector 40 may be formed to have a shape corresponding to the shape of the lower end of the lens 81. Accordingly, the lens 81 can be coupled closely to the reflector 40.

Although the convex lens is used as the lens 80 in this embodiment, the present invention is not limited thereto. A variety of lenses may be used, and a Fresnel lens 82 as shown in FIG. 7 may be used. For example, the Fresnel lens 82 has a low central portion in the form of a convex lens, and symmetrical unevenness portions on the right and left sides of the central portion. As compared with a general convex lens, the Fresnel lens 82 can obtain the same effects and have a more reduced thickness.

A method of fabricating the LED according to the present invention will now be described.

The light emitting chip 50 is first mounted and electrically connected. That is, the electrodes 20 and 30 are formed on the substrate 10, and the light emitting chip 50 is mounted on the substrate 10 or one of the electrodes 20 and 30 by using various mounting methods. Then, the light emitting chip 50 is electrically connected to the other of the electrodes 20 and 30 through the wire 60.

Thereafter, the reflector 40 of which the inner surface 40a has a predetermined slope is formed on the substrate 10 to surround the light emitting chip 50. The annular groove 40b in which the lens 80 is to be seated is formed at a predetermined position on the inner surface 40a of the reflector 40. The groove 40b includes the seating surface and the inner surface inclined in the direction opposite to the inclined direction of the inner surface 40a of the reflector. Preferably, the inner diameter B of the inner periphery of the lower end of the groove 40b is greater than the outer diameter A of the lower end of the lens, and the inner diameter C of the inner periphery of the upper end of the groove 40b is smaller than the outer diameter A of the lower end of the lens 80.

Then, the molding portion 70 is formed in the hollow portion of the reflector 40 to encapsulate the light emitting chip 50. The molding portion 70 can be formed by filling a liquid epoxy resin or silicone resin in the hollow portion and curing the filled resin. At this time, the molding portion 70 is formed to be at the same level as or at a level lower than the position where the groove 40b is formed.

The separately manufactured lens 80 is pressed from above the reflector 40 and then engaged with the groove 40b of the reflector 40. Preferably, any one of the lens 80 and the reflector 40 is elastically deformed so that the lens 80 can be engaged with the groove 40b. That is, when the lens 80 is pressed from above the reflector 40, the lens 80 is elastically deformed, passes by the lens insertion portion of the groove 40b, i.e., the upper end of the groove 40b, having the inner diameter relatively smaller than the diameter of the lens 80, is restored to its original shape at the lower end of the groove 40b having the relatively larger inner diameter, and is finally seated on the seating surface of the groove 40b. The outer peripheral surface of the lower end of the lens 80 and the annular groove 40b of the reflector 40 are configured to be strongly coupled with each other through press-fitting. Thus, after the lens 80 is coupled into the groove 40b, the lens 80 may be separated only by applying a force exceeding a predetermined value. Therefore, the lens 80 coupled into the groove 40b is not easily separated from the reflector 40.

The method of fabricating the LED is not limited to the foregoing but may be implemented in various manners.

As described above, in the LED of the present invention, the lens can be fixed through the simple process of engaging the lens with the groove of the reflector. As a result, the process of fabricating the LED is simplified, resulting in reduced process time and cost and improvement of productivity.

Contrary to conventional LEDs in which fraction defective is high since a lens is often separated due to incomplete curing of an adhesive or deformation of the adhesive occurred in some use environments, the present invention can lower fraction defective depending on processes and use conditions. Further, since the lens can be aligned on the light emitting chip without an error and cannot be easily separated, the durability and reliability of the product are improved.

Furthermore, as compared with the conventional technique of attaching the lens to the upper end of the reflector, the present invention can reduce the thickness of the LED by forming the groove in the inner surface of the reflector and engaging the lens into the groove.

FIGS. 8 and 9 are a sectional view and a perspective view illustrating an LED according to a second embodiment of the present invention, respectively. The LED of the second embodiment is almost identical to the LED of the first embodiment in view of constitutions. The LED of the second embodiment shown in the figures is a side view type LED applicable to a backlight unit module of a liquid crystal display. In the following description, a description overlapping with the above description will be omitted.

Referring to the figures, the LED is generally formed in a hexahedral shape elongated in one direction and comprises a substrate 110, electrodes 120 and 130 formed on the substrate 110, a light emitting chip 150 mounted on the substrate 110 and electrically connected to the electrodes 120 and 130, and a reflector 140 formed on the substrate 110 and having a hollow portion to surround the light emitting chip 150. A molding portion 170 encapsulates the light emitting chip 150 in the hollow portion of the reflector 140. A lens 180 is engaged with a groove 140b formed in an inner surface 140a of the reflector 140.

The groove 140b formed in the reflector 140 includes a seating surface on which the lens 180 is seated, and an inner surface inclined in a direction opposite to the inclined direction of the inner surface 140a of the reflector 140. Preferably, a width of an inner periphery of a lower end of the groove 140b is greater than a width of a lower end of the lens 180, and a width of an inner periphery of an upper end of the groove 140b is smaller than the width of the lower end of the lens 180. Preferably, the lens 180 or the reflector 140 is made of an elastically-deformable material. That is, since the width of a lens insertion portion of the groove 140b, i.e., the upper end of the groove 140b, is smaller than the width of the lens 180, the lens 180 can be engaged with the groove 140b through elastic deformation.

The lens 180 is pressed from above the reflector 140 and then seated in the groove 140b. After the lens 180 is coupled into the groove 140b, the lens 180 is restored to its original shape through elastic deformation. Therefore, the lens 180 is fixedly coupled in the groove 140b so that it cannot be easily separated by an external force.

Although the substrate 10 or 110 and the reflector 40 or 140 have been described as being separately formed in the aforementioned embodiments of the present invention, the substrate and the reflector may be simultaneously made of the same material. For example, the substrate and the reflector may be simultaneously formed by means of insert molding with a thermoplastic resin. In this case, the light emitting chip is mounted on the substrate 10 or 110 on which the reflector 40 or 140 has been formed.

The present invention described above can be applied to products with different structures. The technical sprit and scope of the present invention is not limited to the embodiments and various modifications and changes can be made thereto.

The invention claimed is:

1. A light emitting diode (LED), comprising:
   a light emitting chip;
   a reflector comprising an annular groove in an inner surface of the reflector, the reflector surrounding the light emitting chip;
   a molding portion encapsulating the light emitting chip; and
   a lens engaged with the annular groove of the reflector,
   wherein an inner diameter of a lens insertion portion of the annular groove is smaller than an outer diameter of the lens, the lens configured to be engaged with the annular groove through elastic deformation,
   wherein the lens comprises an outwardly-protruding stepped portion at its peripheral portion for being engaged with the annular groove of the reflector, and a bottom surface of the stepped portion is formed to be aligned with an imaginary plane extending from and including a circular edge of the peripheral portion of the lens, and wherein a lower surface of the annular groove is formed to be included in a plane extending from a top surface of the molding portion.

2. The LED as claimed in claim 1, wherein the lens comprises a convex central portion.

3. The LED as claimed in claim 1, wherein the lens is a Fresnel lens.

4. The LED as claimed in claim 1, further comprising a coating of light reflecting material comprising Al or Ag on the inner surface of the reflector.

5. The LED as claimed in claim 1, wherein the bottom surface of the stepped portion is formed to be included in the imaginary plane including the peripheral portion of the lens.

6. The LED as claimed in claim 1, wherein the lens is seated on the molding portion.

7. A light emitting diode (LED), comprising:
a light emitting chip;
a reflector comprising an annular groove in an inner surface of the reflector, the reflector surrounding the light emitting chip;
a molding portion encapsulating the light emitting chip; and
a lens engaged with the annular groove of the reflector,
wherein an inner diameter of a lens insertion portion of the annular groove is smaller than an outer diameter of the lens, the lens configured to be engaged with the annular groove through elastic deformation,
wherein the lens comprises an outwardly-protruding stepped portion at its peripheral portion for being engaged with the annular groove of the reflector, and the bottommost surface of the stepped portion forms a straight line with the bottommost surface of the lens, and
wherein the bottommost surface of the annular groove is aligned with the topmost surface of the molding portion.

* * * * *